United States Patent
Vergöhl et al.

(10) Patent No.: US 12,421,592 B2
(45) Date of Patent: Sep. 23, 2025

(54) DEVICE AND METHOD FOR COATING SUBSTRATES HAVING PLANAR OR SHAPED SURFACES BY MEANS OF MAGNETRON SPUTTERING

(71) Applicant: FRAUNHOFER-GESELLSCHAFT ZUR FÖRDERUNG DER ANGEWANDTEN FORSCHUNG E. V., Munich (DE)

(72) Inventors: Michael Vergöhl, Braunschweig (DE); Andreas Pflug, Braunschweig (DE); Stefan Bruns, Braunschweig (DE); André Kaiser, Braunschweig (DE); Thomas Melzig, Braunschweig (DE); Tobias Zickenrott, Braunschweig (DE)

(73) Assignee: Fraunhofer-Gesellschaft zur förderung der angewandten Forschung e.V., Munich (DE)

( * ) Notice: Subject to any disclaimer, the term of this patent is extended or adjusted under 35 U.S.C. 154(b) by 222 days.

(21) Appl. No.: 17/601,991

(22) PCT Filed: Apr. 9, 2020

(86) PCT No.: PCT/EP2020/060239
§ 371 (c)(1),
(2) Date: Oct. 7, 2021

(87) PCT Pub. No.: WO2020/208176
PCT Pub. Date: Oct. 15, 2020

(65) Prior Publication Data
US 2022/0213591 A1 Jul. 7, 2022

(30) Foreign Application Priority Data
Apr. 9, 2019 (EP) .................. 19168047

(51) Int. Cl.
*C23C 14/04* (2006.01)
*C23C 14/35* (2006.01)
(Continued)

(52) U.S. Cl.
CPC .......... *C23C 14/044* (2013.01); *C23C 14/352* (2013.01); *C23C 14/505* (2013.01);
(Continued)

(58) Field of Classification Search
CPC .............. H01J 37/3447; H01J 37/3473; H01J 2229/075; H01J 2229/0755; C23C 14/04;
(Continued)

(56) References Cited

U.S. PATENT DOCUMENTS 5,156,727 A * 10/1992 Bjornard ............... C23C 14/044
204/298.25
5,879,519 A * 3/1999 Seeser ..................... C23C 8/02
427/538

(Continued)

FOREIGN PATENT DOCUMENTS

DE 103 08 471 A1 9/2004
DE 102017104858 A1 9/2018
JP H113653 A * 1/1999

OTHER PUBLICATIONS

U.S. Appl. No. 14/234,019, filed Jan. 21, 2014.
(Continued)

*Primary Examiner* — Michael A Band
(74) *Attorney, Agent, or Firm* — Leydig, Voit & Mayer, Ltd.

(57) ABSTRACT

According to the invention, a device is provided for coating substrates having planar or shaped surfaces by means of magnetron sputtering, by means of which device surfaces having any shape, for examples lenses, aspheres or freeform surfaces which have an adjustable layer-thickness profile, (Continued)

can be coated such that a layer function is maintained on the substantially complete surface. A method for coating substrates having planar or shaped surfaces by means of magnetron sputtering is also provided.

9 Claims, 11 Drawing Sheets

(51) Int. Cl.
    *C23C 14/50*     (2006.01)
    *C23C 14/54*     (2006.01)
    *G02B 1/115*     (2015.01)
    *H01J 37/34*     (2006.01)

(52) U.S. Cl.
    CPC ............ *C23C 14/542* (2013.01); *G02B 1/115* (2013.01); *H01J 37/3473* (2013.01)

(58) Field of Classification Search
    CPC ... C23C 14/042; C23C 14/044; C23C 14/505; C23C 14/352; G02B 1/115
    See application file for complete search history.

(56) References Cited

U.S. PATENT DOCUMENTS

| | | | |
|---|---|---|---|
| 6,250,758 | B1 | 6/2001 | Yoshihara et al. |
| 6,562,200 | B2 * | 5/2003 | Iwase ...................... C23C 14/35 |
| | | | 204/192.12 |
| 9,803,276 | B2 | 10/2017 | Vergöhl et al. |
| 2014/0262752 | A1 | 9/2014 | Vergöhl et al. |
| 2016/0254127 | A1 | 9/2016 | Vergöhl et al. |
| 2017/0371224 | A1 | 12/2017 | Seeboth et al. |
| 2021/0164092 | A1 | 6/2021 | Vergöhl et al. |

OTHER PUBLICATIONS

U.S. Appl. No. 15/029,536, filed Apr. 14, 2016.
U.S. Appl. No. 15/540,097, filed Jun. 27, 2017.
U.S. Appl. No. 17/267,106, filed Feb. 9, 2021.
European Patent Office, International Search Report in International Application No. PCT/EP2020/060239 (Jun. 9, 2020).
European Patent Office, Written Opinion in International Application No. PCT/EP2020/060239 (Jun. 9, 2020).
International Bureau of WIPO, International Preliminary Report on Patentability in International Application No. PCT/EP2020/060239 (Sep. 28, 2021).

* cited by examiner

DEVICE AND METHOD FOR COATING SUBSTRATES HAVING PLANAR OR SHAPED SURFACES BY MEANS OF MAGNETRON SPUTTERING

CROSS-REFERENCE TO RELATED APPLICATIONS

This patent application is the U.S. national phase of International Application No. PCT/EP2020/060239, filed on Apr. 9, 2020, which claims the benefit of European Patent Application No. 19168047.9, filed Apr. 9, 2019, the disclosures of which are incorporated herein by reference in their entireties for all purposes.

In accordance with the invention, a device is provided for the coating of substrates having planar or shaped surfaces by means of magnetron sputtering by which surfaces of any desired shape, for example lenses, aspheres, or freeform surfaces having a settable film thickness profile can be coated such that a film function is maintained on substantially the whole surface. Such a method is also provided.

Curved surfaces are widely used in optical systems. Lenses, aspheric components, or also freeform surfaces are used to direct light or to perform imaging of the light. These different shapes will be called "optical components" in the following. Aberrations play a great role here.

As a rule, the optical components are provided with a coating. The coating can have different functions. In some cases a bandpass filter or an edge filter can be applied to the optical component to give the optical system a compact design. A curved surface can also be coated in this process.

The coating is frequently also an anti-reflection (AR) coating that can act either at a specific wavelength or over a wide spectral range. The substrate material is glass or plastic as a rule.

The optical components can be produced by pressing or also by mechanical processing. The substrate material reflects some % of the light in dependence on the material, i.e., the refractive index, of the optical components.

The reflection at air is calculated according to the formula (I)

$$R = (n-1)^2/(n+1)^2 \quad (1)$$

where n is the refractive index of the optical component.

Optical components can also be installed in media such as oils or cement, with then the refractive index of 1 for air through the refractive index of the medium of the environment having to be used in formula (I).

A plurality of optical components are frequently also provided as a kit. The reflection between the components can thus be reduced via the selection of the kit.

In an anti-reflection coating, both sides of the optical components have to be coated as a rule, with a more less wide spectral range being provided. With a simple broadband anti-reflection coating, the range 420-680 nm is frequently AR coated, with a reflection of less than 0.5% being necessary over this range. If it is a flat substrate, a coating of the form:

Glass—$TiO_2$ (10 nm)—$SiO_2$ (40 nm)—$TiO_2$ (110 nm)—$SiO_2$ (85 nm) is sufficient.

$SiO_2$ is a low refractive index material that typically has a refractive index of approximately 1.48 (at a wavelength of 550 nm) as a film. $TiO_2$ is a high refractive index material having a refractive index of 2.4 to 2.7. A plurality of other materials can equally be used in addition to $SiO_2$ and $TiO_2$. $Al_2O_3$ is also suitable as a low refractive index film and $Ta_2O_5$, $Nb_2O_5$, $HfO_2$, $ZrO_2$, $Sc_2O_3$, $Al_2O_3$, or mixtures thereof as high refractive index materials.

The spectral range provided is frequently specified as considerably larger and the residual reflection is also specified as lower. This is particularly important: in optical systems having a plurality of optical components. Not only the light losses are important there, but rather also ghost images due to light reflected multiple times in the system. They are produced in that residual light can be reflected at the individual surfaces. It then partially returns to the optical path, but no longer has the desired imaging property. This light can then enter into the deflector via a plurality of reflections as interfering or scattered light. Scattered light can reduce the contrast or ghost images can be produced. With a larger spectral range and smaller residual reflection, the number of layers and thus the total film thickness has to be increased as a rule.

Various filters can also be used in addition to reflection reducing films.

Such a filter generally likewise consists of a sequence of alternatingly high and low refractive index films having film thicknesses. The individual film thicknesses can amount to between 1 and several 100 nm depending on the application. With filters, the total number of layers typically amounts to more than 10 and can also reach multiple hundreds. Total film thicknesses of, for instance, 1000 nm to more than 30,000 nm thus result in the visible spectral range. In the infrared range, the layer thicknesses can even reach or can even exceed 100,0000 nm.

The use of a filter directly on the curved component has the advantage that the optical system can have a considerably more compact design. The use of a planar filter can thus be dispensed with if a filter can be affixed directly to the lens surface. Such filters can be a bandpass filter. It transmits a narrow and exactly defined spectral range and blocks the remaining spectral range. Such a bandpass filter can be used, for example, in a LIDAR system. The light emitted by the laser is there measured as scattered light of the environment. The LIDAR signal is substantially weaker than the light of the environment so that a suppression of the environmental light has to take place. On a lens, a LIDAR filter for a 532 nm laser would therefore have a bandpass of 10 nm full width half maximum and a blocking between 200 nm and 1100 nm at OD 6. If the filter is directly affixed to the optical component, this has the advantage that the environmental light is always incident on the filter as perpendicular. With a planar substrate, in contrast, an intermediate imaging would have to be performed so that the light is always incident on the filter as perpendicular.

With optical components, the further case frequently occurs that the light is incident in parallel over the total lens surface. If it is a convex, concave, or a freeform surface, the angle of incidence of the light on the surface is not constant, but rather dependent on the point at which the light is incident. At the center, the incidence of light is perpendicular; at the margin of the lens, the angle of incidence is larger and is dependent on the shape of the optical component. There are also applications in some cases in which light rays pass through one and the same optics multiple times at different opening angles. Different regions of the lens are utilized here, for example.

With freeform surfaces, there is additionally no rotational symmetry, i.e., the curvature is dependent on the angular position of the optical element.

The effect of the different angles of incidence of the light on the surface has the result that the spectrum shifts toward shorter wavelengths. The shape of the spectrum can also itself change.

It may therefore be favorable to apply the coating such that it is thicker at the margin of the optical component than at the center so that the effect of the angle shift is compensated. If the light is incident on the lens as perpendicular from above, a spectral correction takes place so that no spectral shift of the spectra or no change of the intensities on transmission or on reflection take place. The transmitted or reflected spectrum is equally independent of the point at which the light is incident.

On an application in which different regions of the lens are passed through by different light rays having different opening angles, the variation of the film thickness could also be designed differently.

The coating of optical components can take place using chemical processes. In this respect, for example, the process of atomic layer deposition (ALD) can be used. It is, however, a disadvantage of ALD that there is practically no possibility of varying the coating on the component in a targeted manner. In the ideal case, a homogeneous uniform coating also results on 3D components. The effect of the angle shift with light incident in parallel can therefore not be compensated by such a process.

Methods of physical vapor deposition (PVD) are furthermore frequently used, in particular evaporation deposition or sputtering methods. In the PVD processes, there is either no chemical reaction of the film-forming particles or, in the case of reactive PVD processes, the reaction takes place exclusively at the reactor surface or substrate surfaces. The deposition takes place by evaporation from a crucible at high vacuum or by sputtering from a target at typical working pressures of 0.05 to 3.0 Pa, preferably of 0.1 to 1 Pa.

In magnetron sputtering, a relatively fast turntable rotation preferably takes place. The substrates are here fixed to the turntable and are thus moved in a rotational and periodic manner through coating reactors having statically positioned sputtering sources. A respective thin partial film of a metal or of a metal compound is applied on every pass. The stoichiometry of the metal compound can be adapted in an additional, optional plasma chamber.

The magnetron sputtering sources can be planar or also cylindrically shaped. They can additionally be designed as a single or dual magnetron system.

With a rotational substrate arrangement with linear coating sources, the film profile resulting on the substrate is not homogeneous. With a flat substrate, the rate decreases toward the outside with a dependency in accordance with $1/r$, with r corresponding to the distance between the turntable center and the observed point of the substrate.

If the substrate is curved, additional film thickness variations result due to the different distances between the sputtering source and the substrate and due to different angles of inclination of the substrate surface with respect to the direction of coating.

A typical approach for the compensation of the film thickness distribution on the lens and the angle shift comprises compensating these effects via a special design. However, the film design here become very complex and can consist of a very large number of layers.

With coating devices having slowly rotating tables or drums (i.e., the turntable rotates at frequencies of less than 50 r.p.m.), a fast planetary rotation of the optical components is frequently provided. As a rule of thumb, the rotation of the components should be at least 10 times faster than the rotation of the table or of the drum. The film profile can thus be compensated on a fast rotation of the substrate.

A mechanism is proposed in U.S. Pat. No. 6,250,758 B1 by which lenses can be homogeneously coated with an anti-reflection coating. The substrates are fixed to a rotating table in this process and can be rotated about their own axes. An additional uniformity mask is used here.

The use of a fast rotation substantially has the following disadvantages:

The fast rotating parts can generate abrasion and thus to an increasing degree particles.

In the case of heavy optical components, the forces are very large so that, for example with cemented components, the latter can fall apart.

The rotation is random since the turntable rotation itself is already so large that interference in the film distribution can occur.

A fast rotation can only deliver a symmetrical film function with rotationally symmetrical components, but not with freeform surfaces that do not have any rotational symmetry.

Starting from this, it was the object of the present invention to provide a device and a method with which optical components having shaped surfaces, e.g., lenses, aspheres, freeform surfaces, can be coated with a settable film thickness profile, with said disadvantages of the methods known from the prior art being avoided.

This object is achieved by the features of the device described herein, by the features of the method described herein, and the advantageous developments thereof.

In accordance with the invention, a device is provided for coating substrates having planar or shaped surfaces by means of magnetron sputtering that comprises the following components:

a) a vacuum chamber;

b) at least one magnetron source having at least one magnetron electrode as the coating source;

c) a turntable having at least one substrate holder, with the turntable enabling a first rotational movement of the substrate and the at least one substrate holder enabling a second rotational movement;

d) at least one controllable motor that is coupled to the substrate holder or holders and that effects the second rotational movement of the substrate; and e) a gradient mask having a first region that has a geometry for the inhomogeneous coating of the substrate, with the gradient mask having at least one local elevated portion or at least one local depression in profile, with the film thickness gradient on the substrate being settable via the slope at the flank of the elevated portion or depression; and second region having a geometry that effects a homogeneous coating of a reference substrate.

It is proposed in accordance with the invention that the rotation of the lens takes place by means of a controllable motor adapted to the film system. The rotation should takes place in this process such that the lens is preferably rotated by a defined angle in that time period in which it is not below one of the sources. In this respect, a controllable motor suitable for vacuum can be used that is located on a substrate holder and at whose axle the optical component is located. A stepper motor or a DC motor is preferably used as the controllable motor. However, an analog-controlled electric motor that has position detection is also possible.

The cyclic and slow rotation has the advantage that only a little power is consumed. It is therefore preferred that the power supply is performed with the aid of a suitable battery directly on the substrate holder, whereby electric rotary feedthroughs can be avoided.

In accordance with a preferred embodiment, the device has a gradient mask that effects an inhomogeneous material removal rate of the source material. This gradient mask or shaper mask is designed such that both a homogeneous zone for the monitoring and a zone having a gradient are produced. The shape of the gradient mask can be determined with the aid of a simulation of the coating process and an optimization algorithm; it can, however, also be produced iteratively by manual processing.

The gradient mask preferably projects the furthest into the coating region for convexly shaped substrates in the region of the running direction of the center of the lens and has an opening shape from there so that at least one rounded peak is produced, i.e., at least one local elevated portion. The film thickness gradient on the substrate is settable via the slope at the flank of the elevated portion. In the second region, the gradient mask has a geometry that effects a homogeneous coating of the reference substrate.

The gradient mask for convexly shaped lenses preferably has a geometry that is furthest removed from the coating region in the region of the direction of running of the center of the lens and has a shape projecting into the coating region from there so that at least one inverted shape of a rounded peak is produced, i.e., at least one local depression. The film thickness gradient on the substrate is settable via the slope at the flank of the elevated portion. In the second region, the gradient mask has a geometry that effects a homogeneous coating of the reference substrate.

A further preferred embodiment provides that the coating source has an inhomogeneous plasma density that effects an inhomogeneous removal rate of the source material. This coating source having an inhomogeneous plasma density can contribute to producing specific rate profiles along the target axis. These rate profiles can be additionally amplified by a further gradient mask.

The stepper motor is preferably reversibly or irreversibly fixed to the substrate holder.

The stepper motor can preferably be combined with a reduction gear to resolve the rotation of the substrate about the z axis more finely.

There is alternatively also the possibility that the substrate is rotated by an externally connected motor. The connection between the motor and the substrate holder can be performed with a vacuum-suitable shaft. In this process, a lifting device also has to be provided in that the substrate holder is raised from the turntable, is then rotated, and is then lowered again. The turntable has to be stopped in each case here. It can be necessary in this respect that one or more intermediate stops of the turntable are necessary with a single film. Three intermediate stops are favorable here so that the component is coated at three different positions. The procedure therefore consists of the following steps:

pausing the coating by closing a shutter;
stopping the turntable;
positioning via the lifting and rotating device;
raising the substrate holder;
rotating the substrate holder by a defined angle;
lowering the substrate holder;
starting the turntable; and
continuing the coating by opening the shutter.

It is recommended here to carry out the optical monitoring on a separate table that is not rotated.

In addition to a rotation about the component's own axis, an additional tilting of the component by a defined angle is generally also possible. A further degree of freedom is thus produced by which the distribution of the coating over the component can be controlled.

The device comprises a linear or annular magnetron source as the coating source. It can be designed as a single or dual magnetron source.

All those materials can be used as substrates of which it is known from the prior art that they are suitable for use in optical components. The substrate preferably consists of a glass or of a plastic. Quartz, borosilicate glass, sulfur hexafluoride (SF6), or combinations hereof are preferred as the glasses. Preferred plastics are polyallyl diglycol carbonate (PADC or CR39), polycarbonate, PMMA, or combinations hereof.

The substrate is preferably an optical component, in particular selected from the group consisting of lenses, aspheres, or freeform optics.

In accordance with the invention, a method is also provided for coating substrates having planar or shaped surfaces by means of magnetron sputtering in which
a) at least one substrate is arranged in an associated substrate holder on a turntable in a vacuum chamber, with the turntable enabling a first rotational movement of the substrate and the at least one substrate holder enabling a second rotational movement, with the second rotational movement taking place via a controllable motor coupled to the substrate holder;
b) at least one film is deposited on the at least one substrate using at least one coating source consisting of at least one magnetron source, with the layers of source material of the magnetron electrodes being formed by sputter gas and optionally by an additional adding of reactive gas, with a gradient mask having
a first region (34) that has a geometry for the inhomogeneous coating of the substrate, with the gradient mask having at least one local elevated portion or at least one local depression in profile, with the layer thickness gradient on the substrate being settable via the slope at the flank of the elevated portion or depression; and
a second region (35) having a geometry that effects a homogeneous coating of a reference substrate,
being used; and
b) the first rotational movement being coordinated with the second rotational movement such that the second rotational movement only takes place outside the coating cycle.

A gradient mask is preferably used in step b) for the deposition of films that produce a gradient with respect to the film thicknesses, with the gradient mask preferably having a first region for the inhomogeneous coating of the substrate which projects furthest into the coating region for convexly shaped substrates in the region of the direction of running of the center of the lens and from there has an opening shape such that at least one rounded peak is produced, i.e., at least one local elevated portion. The film thickness gradient on the substrate is set via the slope at the flank of the elevated portion. In the second region, the gradient mask has a geometry that effects a homogeneous coating of a reference substrate.

A further preferred embodiment provides that a gradient mask is used in step b) for the deposition of films that produce a gradient with respect to the film thicknesses, with the gradient mask preferably having a first region that has a geometry for the inhomogeneous coating of the substrate in that for concavely shaped lenses in the region of the direction of running of the center of the lens furthers from the coating region is taken out and from there has a shape that projects into the coating region such that an inverted shape of a rounded peak is produced, i.e., at least one local depression. The film thickness gradient on the substrate is set via the slope at the flank of the elevated portion. In the second region, the gradient mask has a geometry that effects a homogeneous coating of a reference substrate.

It is preferred that the shape of the gradient mask is detected via the local distribution of the coating rate, with the coating rate being determined via the shape of the lens in dependence on the mask shape.

The first rotational movement of the turntable preferably takes place here at a speed of 10 to 300 r.p.m., preferably 50 to 270 r.p.m., and particularly preferably 70 to 250 r.p.m. A film thickness of preferably 0.01 nm to 0.54 nm, and particularly preferably of 0.05 to 0.18 nm, is thus achieved on every pass, whereby a coating rate of 0.1 nm/sec to 1 nm/sec can be achieved.

The deposited total film thickness is in the range from 1 to 1000 nm, preferably 3 to 500 nm. The respective film thickness is here oriented on the respective film design that can have film thicknesses of a few nm to multiple 100 nm per single film.

It is preferred that a continuous first rotational movement takes place for every deposited film at a speed of 10 to 300 r.p.m., preferably 50 to 270 r.p.m., and a step-wise second rotational movement takes place with n steps and a movement by an angle of 360°/n, where n=3, 6, 9, etc.

The rotation preferably takes place in predefined steps and is controlled by software. The increment is preferably calculated so that a specific film profile is produced at every angular position. The number of required steps is calculated in advance by the software.

Whereas a rotational symmetry around the center of the component is present with lenses and aspheres, this is generally no longer the case with freeform surfaces. In this respect, the step control is preferably adapted for freeform surfaces so that an adapted film thickness profile is achieved for a specific region of the freeform optics.

The method in accordance with the invention and the device in accordance with the invention can also be used to deposit specific gradients on planar surfaces, whereby gradient filters can be produced. This is advantageous because the gradient of the gradient filters is not straight, but rather describes a circular path. An additional homogenization of the film thickness distribution on planar substrates can equally be performed.

The method in accordance with the invention can also be used to utilize gradients with different slopes. Step profiles can thus also be produced, for example. This is helpful if, for example, a plurality of smaller objects are to be coated that should each have a homogeneous coating, but in which the layer thickness respectively differs.

Different gradients can also be applied to one component using the method in accordance with the invention. This is useful if e.g., a lens is passed through multiple times by a beam, with the opening angle and/or the angle of incidence differing.

BRIEF DESCRIPTION OF THE DRAWINGS

The subject matter in accordance with the invention will be explained in more detail with reference to the following Figures and examples without intending to restrict it to the specific embodiments shown here.

DETAILED DESCRIPTION OF THE INVENTION

Figure 1:
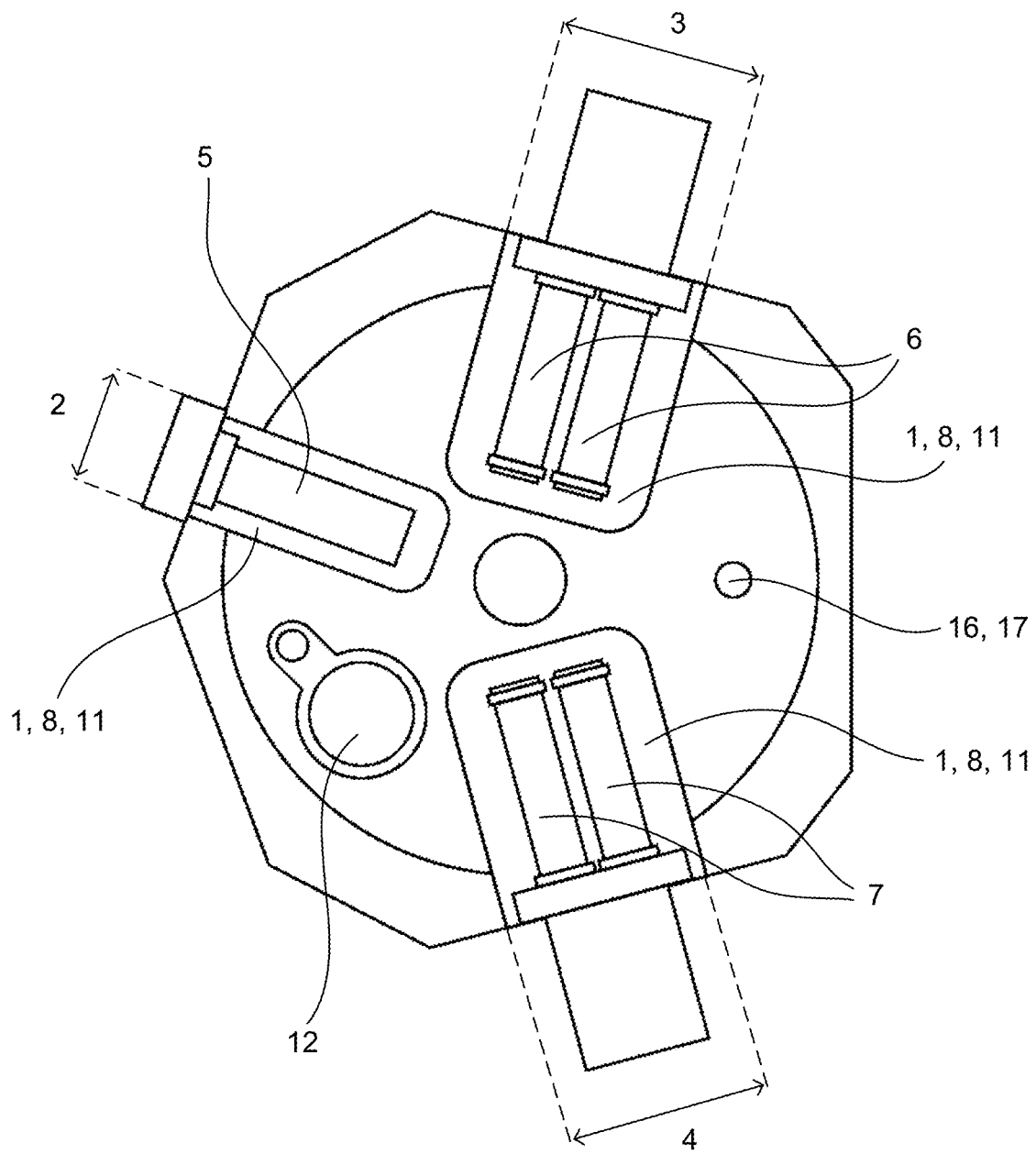
FIG. 1 shows a device without a turntable in a plan view.

FIG. 1 schematically shows a preferred device in accordance with the invention without a turntable in a plan view. The device has three magnetron sputtering devices 2, 3, 4, of which one is designed in the single magnetron arrangement 2 and two in the dual magnetron arrangement 3, 4. The magnetron sputtering device 2 comprises a magnetron electrode 5, sputtering gas 11 and optionally reactive gas 8 and is in a vacuum 1. The magnetron sputtering devices 3, 4 each comprise two magnetron electrodes 6, 7, sputtering gas 11, and optionally reactive gas 8 and are in a vacuum 1. A plasma source 12 and a photometer 16 and/or an ellipsometry flange 17 are located in the vicinity of the magnetron sputtering devices 2, 3, 4.

Figure 2:
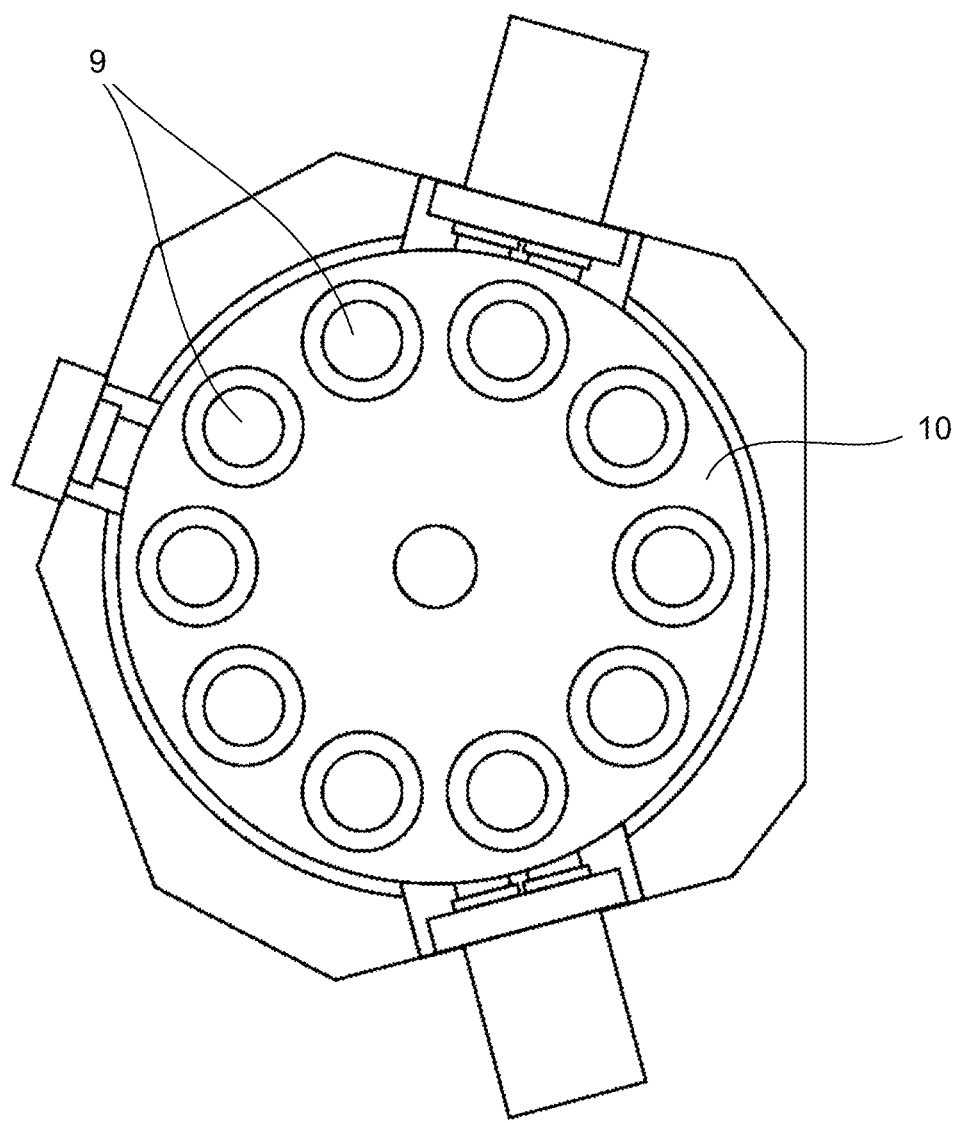
FIG. 2 shows a device with a turntable in a plan view.

FIG. 2 schematically shows a preferred embodiment of the turntable in a plan view. The turntable 10 is located in the device and in this example has ten identical substrate holders 9.

Figure 3:
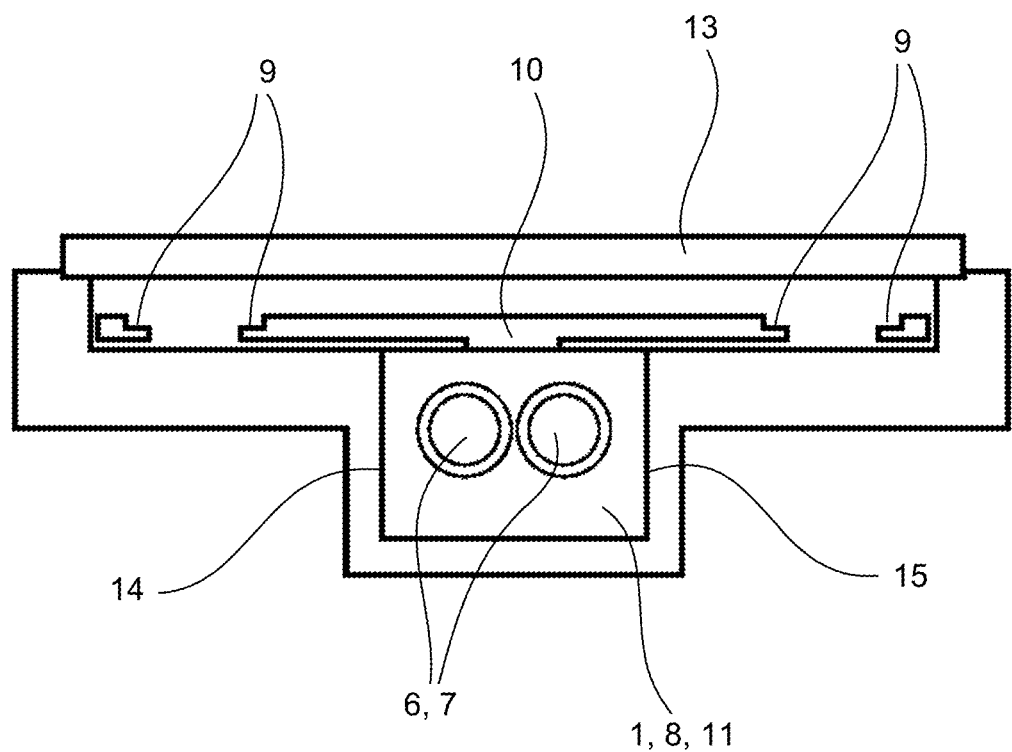
FIG. 3 shows a device with a turntable in a sectional view.

FIG. 3 schematically shows a preferred embodiment of the device with a turntable 10 in a side view. The cross-section of a magnetron sputtering device is visible which comprises two cylinders of source material 6, 7 (dual magnetron arrangement). The magnetron sputtering device is delineated in a gas-tight manner from the rest of the device at the sides of boundary walls 14, 15 and at the top by the turntable 10; it comprises sputtering gas 11, optionally reactive gas 8 and is in a vacuum 1. Two substrate holders 9 of the turntable 10 are shown or visible in the cross-section. A cover 13 is located above the turntable 10 and has boundary walls which are located to the side of the turntable 10 that closes the device in a gas-tight manner.

Figure 4:
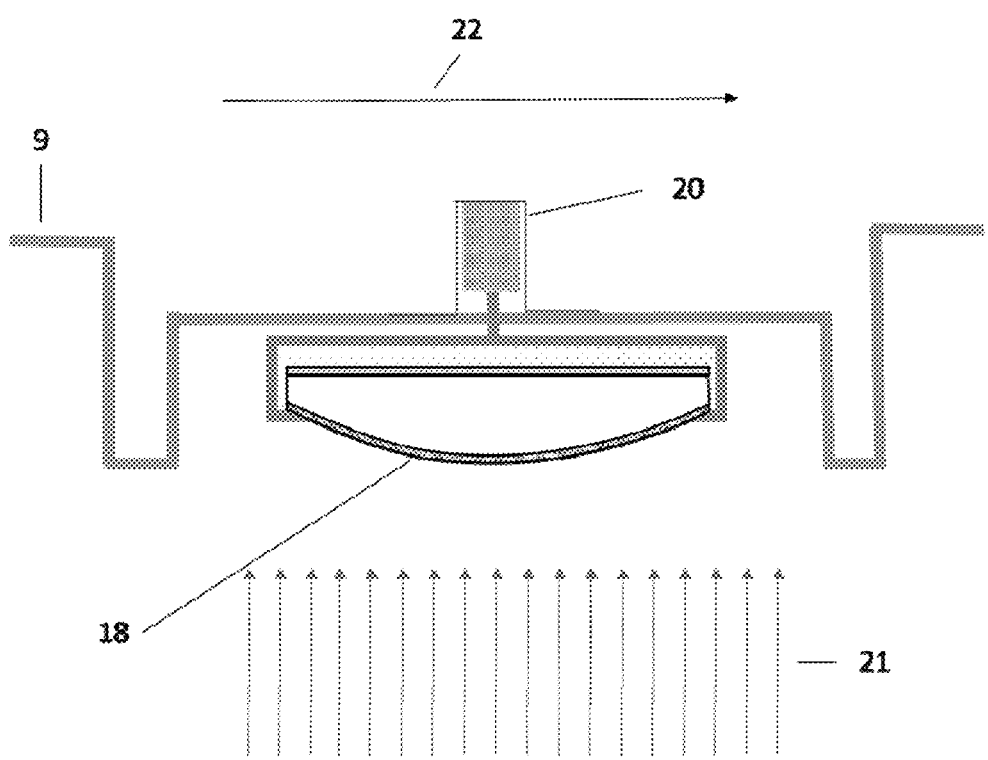
FIG. 4 shows a first substrate holder in accordance with the invention in a sectional view.

FIG. 4 shows the design of a substrate holder 9 in accordance with the invention. A lens 18 is here rotatingly coupled to the axle of a motor 20. The motor 20 is fixedly mounted on the substrate holder 9 and can be controlled from external. A monitor region is not provided here. The direction of coating 21 takes place from bottom to top and the movement 22 of the substrate holder from left to right.

Figure 5:
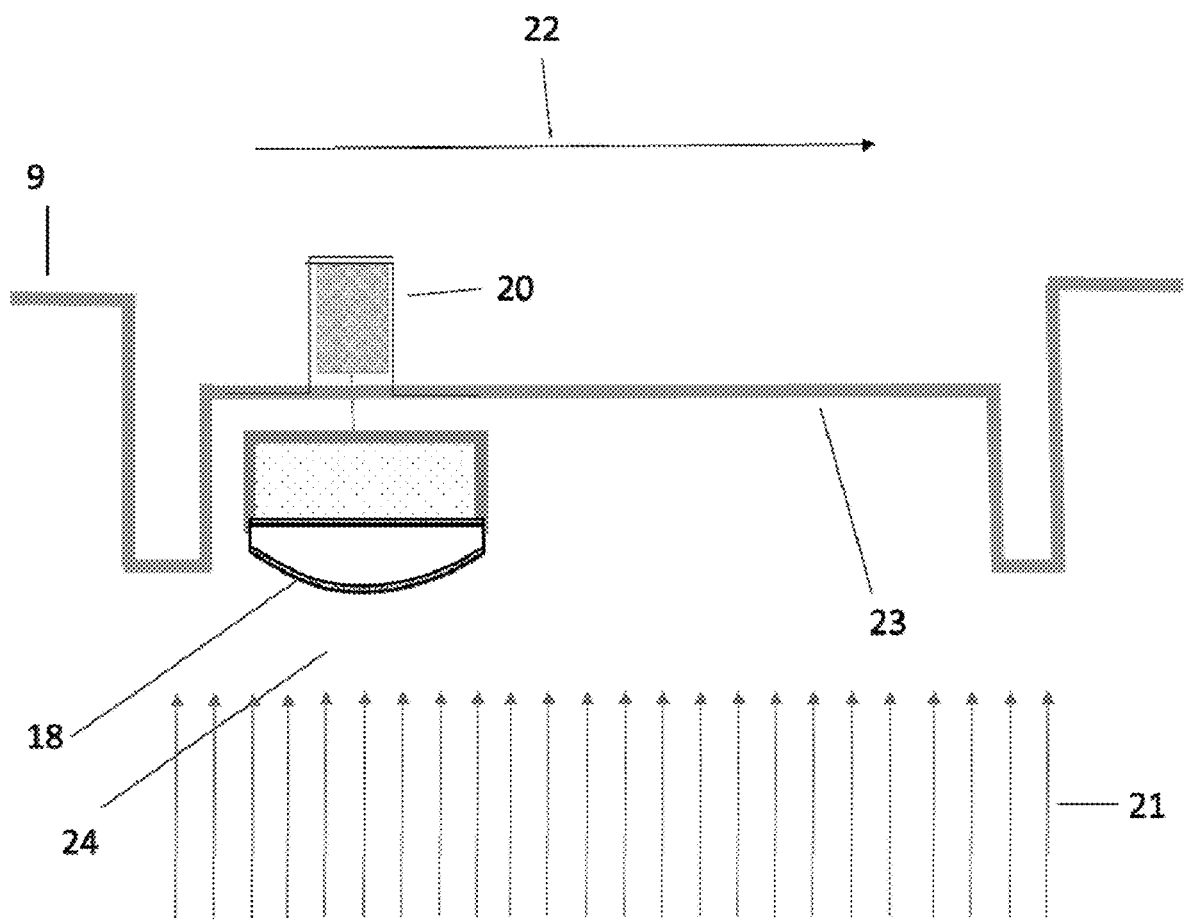
FIG. 5 shows a second substrate holder in accordance with the invention in a sectional view.

FIG. 5 shows a design of a lens 18 to be coated in a further substrate holder 9 in accordance with the invention. The lens 18 is located in a region 24 in which the coating rate has a lateral gradient, while a coating region 23 without a gradient is provided for the reference measurement. The monitor glass provided for this purpose can run along on the substrate holder 9 shown or can be located on one of the other substrate holders 9.

Figure 6A:
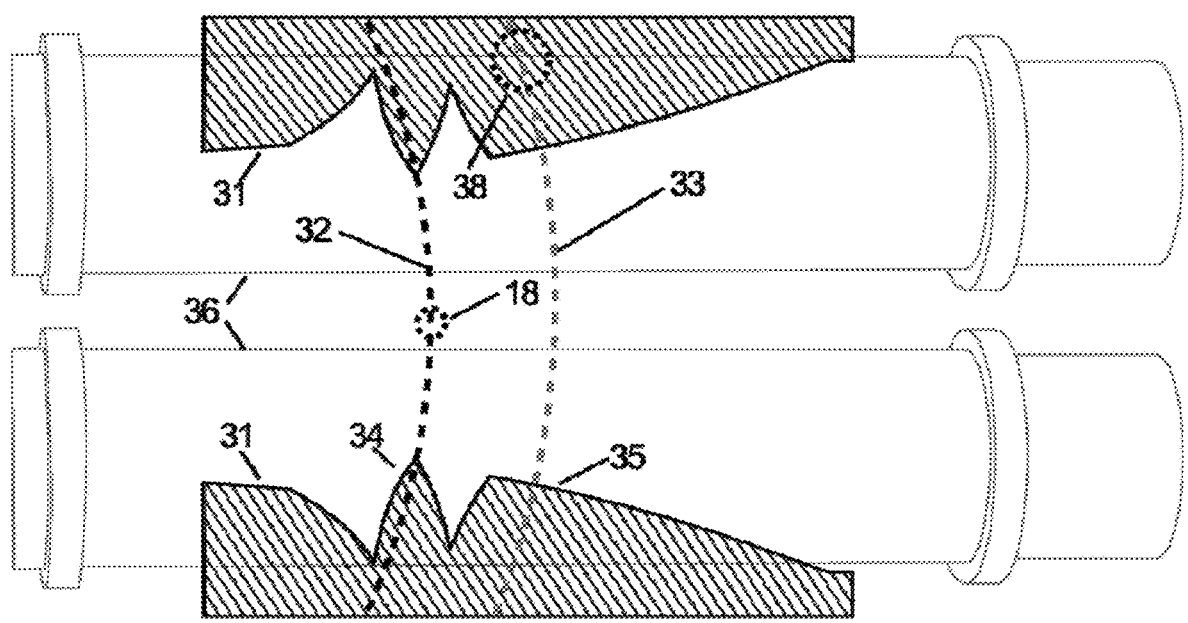
FIG. 6a shows a first variant of a gradient mask in accordance with the invention.

FIG. 6a shows a first arrangement in accordance with the invention with the dual magnetron 36, the lens 18, and the reference glass 38. The gradient mask 31 is shaped such that it enables a homogeneous coating region 35 on a planar substrate and a region 34 with a lateral film thickness gradient. The region 34 having a lateral film thickness gradient lies on the circular path 33 and has a local elevated portion in the form of a peak. The slope of the flanks of this local elevated portion here determines the film thickness gradient on the substrate. In the region of the circular path 33 on which the reference glass 38 is arranged, the latter is homogeneously coated, which is implemented by the sloping down profile of the gradient mask in the homogeneous region 35. This embodiment of the gradient mask enables the coating of convex substrates.

Figure 6B:
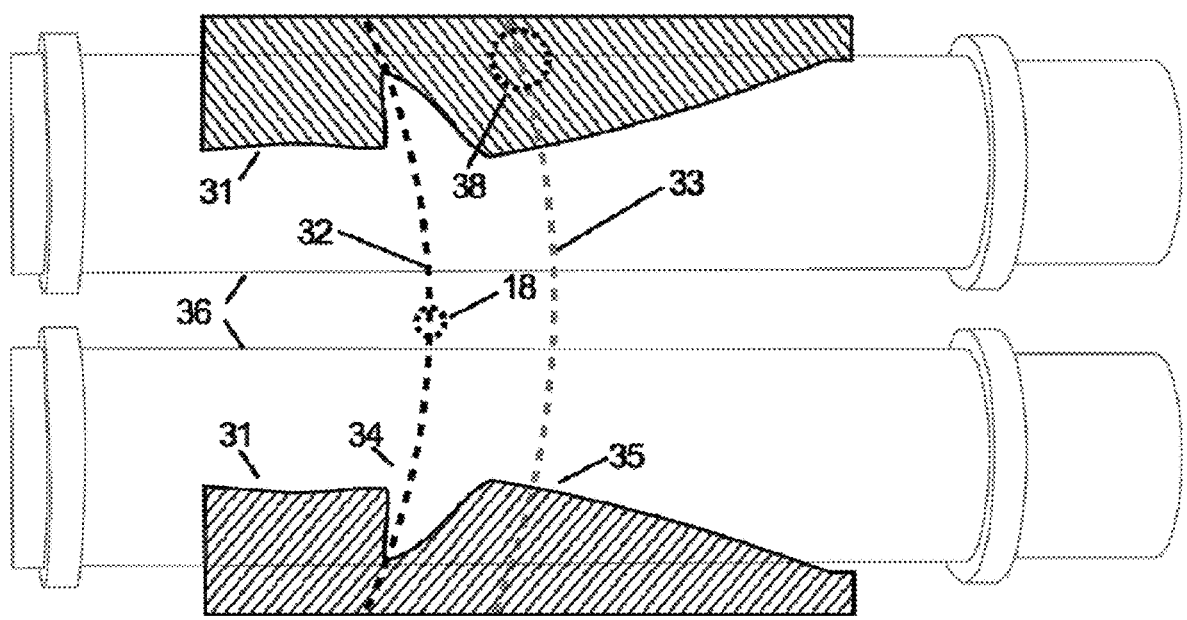
FIG. 6b shows a second variant of a gradient mask in accordance with the invention.

FIG. 6b shows a second arrangement in accordance with the invention with the dual magnetron 36, the lens 18, and the reference glass 38. The gradient mask 31 is shaped such that it enables a homogeneous coating region 35 on a planar substrate and a region 34 with a lateral film thickness gradient. The region 34 having a lateral film thickness gradient lies on the circular path 33 and has a local depression in the form of a valley. The slope of the flanks of this local depression here determines the film thickness gradient on the substrate. In the region of the circular path 33 on which the reference glass 38 is arranged, the latter is homogeneously coated, which is implemented by the sloping down profile of the gradient mask in the homogeneous region 35. This embodiment of the gradient mask enables the coating of concave substrates.

Figure 6C:
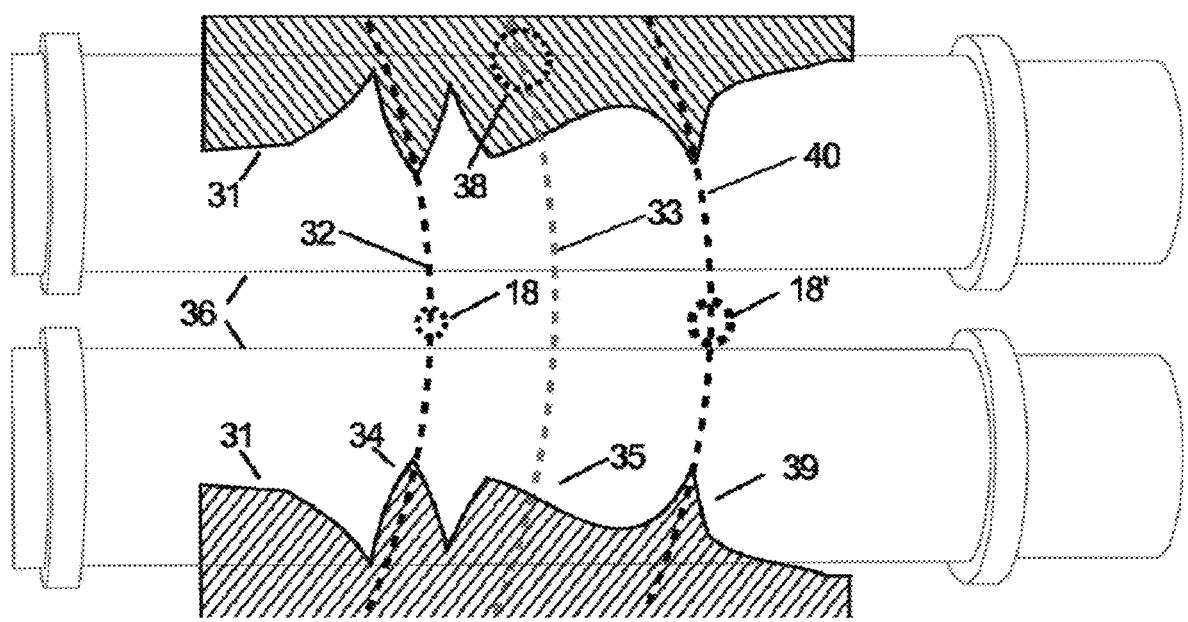
FIG. 6c shows a third variant of a gradient mask in accordance with the invention.

FIG. 6c shows a third arrangement in accordance with the invention with the dual magnetron 36, the lenses 18 and 41, and the reference glass 38. The gradient mask 31 is shaped such that it enables a homogeneous coating region 35 and two regions 34 and 39 with lateral film thickness gradients on a planar substrate. The regions 34 and 39 having lateral film thickness gradients lie on the circular paths 33 and 40 and each have a local elevated portion in the form of a peak. The slope of the flanks of this local elevated portion here determines the film thickness gradient on the substrate. In the region of the circular path 33 on which the reference glass 38 is arranged, the latter is homogeneously coated, which is implemented by the sloping down profile of the gradient mask in the homogeneous region 35. This embodiment of the gradient mask enables the coating of two convex substrates.

Figure 7:
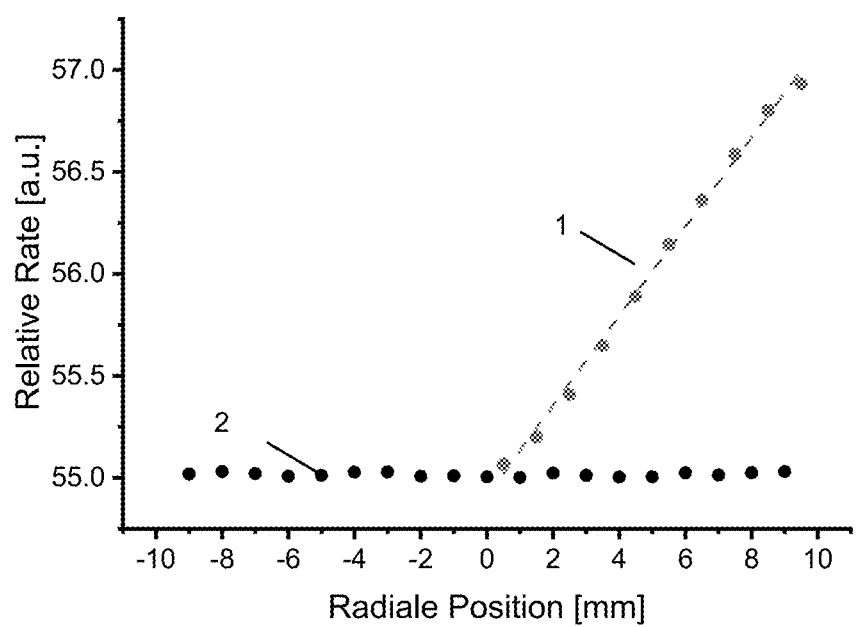
FIG. 7 shows the coating rate in dependence on the radial position of the lens with reference to a diagram.

FIG. 7 represents the relative coating rate on the flat reference glass 19 or on the rotating lens 18. An increasing rate from the center to the outside (from the x axis 0 up to 10 mm to the right) results on the lens 9. The data points 1) in FIG. 8 are mirror symmetrical to the position 0 of the x axis.

Figure 8:
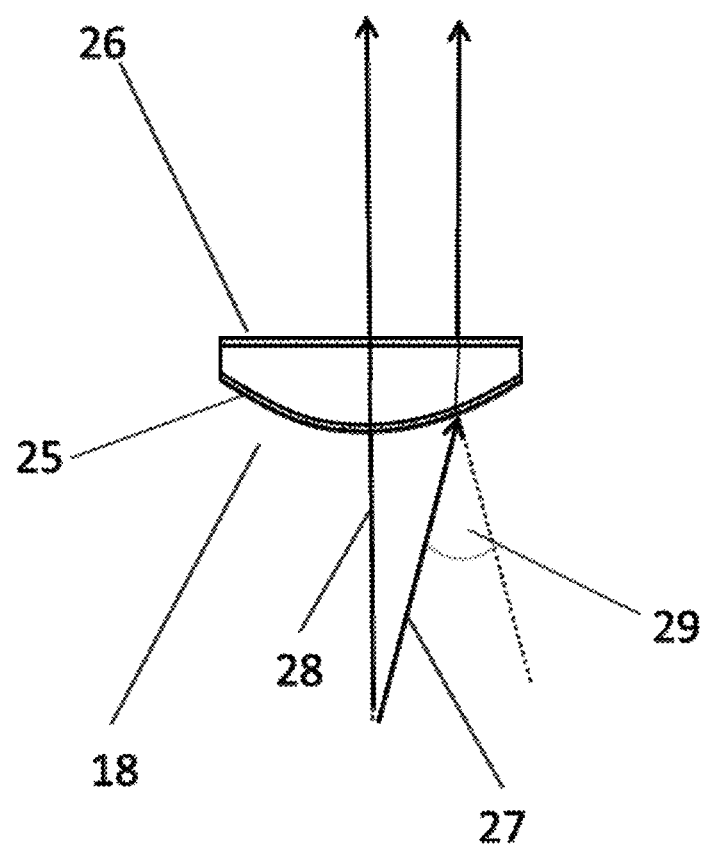
FIG. 8 shows a lens coated in accordance with the invention.

FIG. 8 shows a lens 18 such as can typically be coated. It has a diameter of 20 mm and a radius of curvature of 25.8 mm. A light ray 28 incident on the lens 18 as perpendicular and a light ray 27 obliquely incident on the lens 18 are shown. The angle of incidence 29 increases at the focal point from 0° at the center to 16° at a point 5 mm remote from the center. This lens was coated with a bandpass filter on the convex side 25. A coating with broadband, anti-reflection, or blocker can take place on the planar side 26.

Figure 9:
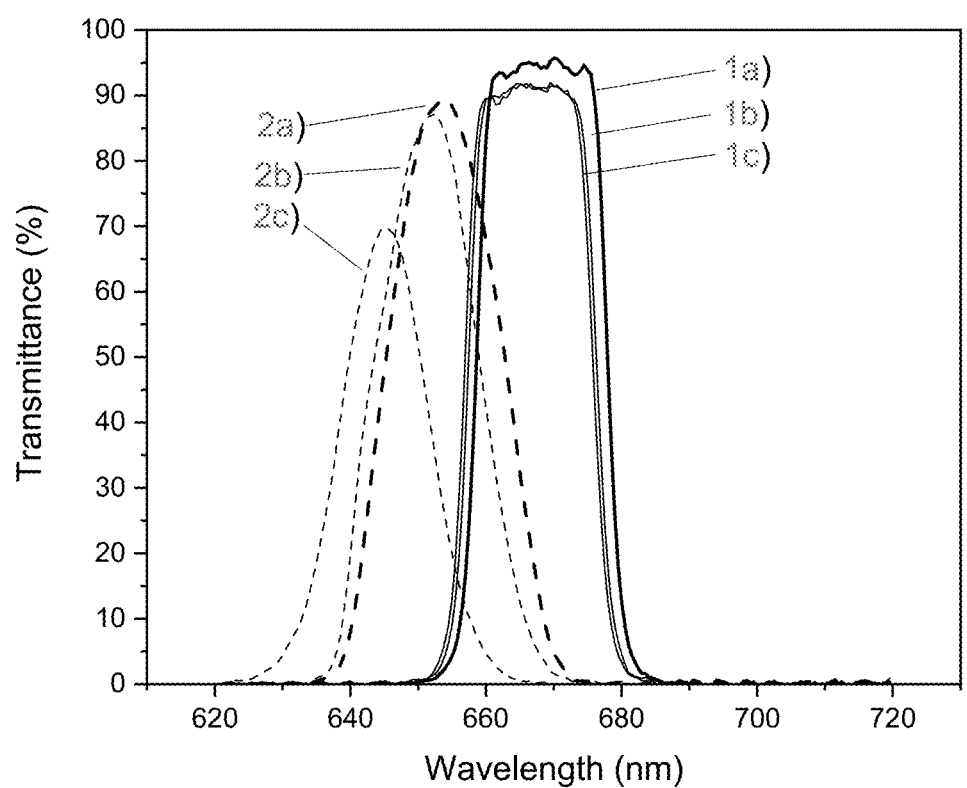
FIG. 9 shows a spectrum of a lens coated in accordance with the invention.

FIG. 9 shows measured spectra of the coated lenses at different positions. The coating consists of a bandpass having a central wavelength of approximately 665 nm. $SiO_2$ and $Ta_2O_5$ were used as low refractive index and high refractive index materials respectively.

Example 1

An $SiO_2$ film having a thickness of 100 m is applied in a layer stack. The dynamic rate amounts to 0.4 nm/sec with a rotating table having a rotation frequency of 240 r.p.m., i.e., 0.1 mm per revolution. 1000 runs are then required for the 100 nm film. In this example, a rotation by 90° is carried after 250, after 500, and after 750 revolutions.

Example 2

In a second example a rotation is carried out by 9° after every 25 revolutions to achieve a finer division.

Example 3

Determining the Geometry of the Gradient Mask

The aim of the coating of lenses with optical filters is that the filter works the same over the total lens surface, i.e., e.g., the same transmission spectrum and reflection spectrum should result over the total lens surface for every light ray through different points of the lens. Two effects are taken into account here:
  The lens surface has a different surface inclination at different radii depending on the lens shape.
  Depending on the design of the optics, the light rays are incident on the different radial positions at a different angle, e.g., it makes a difference whether the lens is impinged by collimated or divergent light.

An "angular spectrum" is corresponding typically specified for a lens, i.e., the mean angle of incidence of the light as a function of the radial distance from the lens center. Depending on the angle of incidence, more or less pronounced spectral shifts result for an optical filter and this has to be compensated by a variation of the film thickness.

Due to an optical modeling of the filter for different angles of incidence of light, the relative film thickness as a function of the radial position from the lens center (fixed at 100% film thickness at the lens center) is ultimately obtained as the target function.

The mask form ensures an implementation of this target function that is as good as possible. The mask shape can be different depending on the lens shape, the geometry of the coating process, and also on the optical filter design.

The determination of the mask shape takes place in the following manner on the basis of this knowledge:

There is no simple, intuitive relationship between the mask shape and the resulting film thickness profile on the lens. A "digital twin" of the process was developed by which the effect of the mask shape on the film thickness distribution can be simulated. A mask shape adapted to the target function can also be determined while using an optimization algorithm.

This has the advantage that the mask shape does not have to be determined in a large number of iterative experiments. The mask shape for the example of a bandpass filter on a spherical lens was determined with the aid of the digital twin and then no longer had to be reworked for the experiments.

The mask shape is implemented by consecutive arcs in this concept. Coordinate points $\{x_k, y_k\}_{k=1 \ldots N}$ and circle radii $\{r_k\}_{k=1 \ldots N-1}$ were considered by means of software. The X coordinate here faces outward from the turntable center in the radial direction; the Y coordinate faces transversely thereto, i.e., in the direction of movement of the lens. The circle radii are positive for a concave arc and negative for a convex arc.

The circle center $(xm_k, ym_k)$ of the respective arc is first calculated with reference to the radius $r_k$ between two consecutive points $(x_k, y_k)$, $(x_{k+1}, y_{k+1})$. The shape of the mask is subsequently shown as the function $y(x)$:

$$y(x)=ym_k\pm\sqrt{r_k^2-(x-xm_k)^2}; x\in[xm_k,xm_{k+1}]$$

The positive sign is selected if $r_k<0$, otherwise the negative sign is selected.

The digital twin calculates the resulting film thickness distribution on a lens moving through the coating compartment using this parameterization. A fit algorithm is used for the determination of the mask shape in which some of the variables of both the coordinate points $\{x_k, y_k\}$ and the circle radii $\{r_k\}$ are deallocated and varied until the calculated film thickness profile corresponds as exactly as possible to the target function.

With a convex lens, the film thickness should increase toward the margin; this then produces a characteristic mask shape in which a locally serrated thickened portion of the mask impinges on the center of the lens rotating past.

The invention claimed is:

1. A device for coating substrates by magnetron sputtering comprising
    a) a vacuum chamber;
    b) at least one magnetron source having at least one magnetron electrode as coating source;
    c) a turntable having at least one substrate holder, with the turntable enabling a first rotational movement of at least one substrate and the at least one substrate holder enabling a second rotational movement;
    d) at least one controllable motor that is coupled to the at least one substrate holder and that effects the second rotational movement of the at least one substrate; and
    e) a gradient mask having
        a first region that has a geometry for an inhomogeneous coating of the at least one substrate, with the gradient mask having at least one local elevated portion or at least one local depression in profile, with a film layer thickness gradient on the at least one substrate being settable via a slope at a flank of the at least one local elevated portion or the at least one local depression in profile; and
        a second region having a geometry that effects a homogeneous coating of the at least one substrate
    wherein a controller of the device is configured to control the at least one controllable motor that is coupled to the at least one substrate holder and, by said control, to coordinate the first rotational movement with the second rotational movement such that the second rotational movement only takes place in a time period in which the at least one substrate is not below the at least one magnetron source,
    wherein the controller is configured to control the at least one controllable motor such that the second rotational movement of at least one substrate is a step-wise rotational movement taking place with n steps and a movement by an angle of 360°/n, wherein n is an integer multiplied with 3, wherein the first rotational movement of the turntable is configured to a speed of 10 to 300 r.p.m.;
    the second rotational movement of the at least one substrate is configured to predefined steps and is controlled by software, wherein an increment of the predefined steps is calculated so that a specific film profile is produced at every angular position of the at least one substrate, wherein a number of the predefined steps is calculated in advance by the software;
    the at least one controllable motor is fixed to the at least one substrate holder and arranged inside the vacuum chamber;
    the gradient mask is a single gradient mask and is shaped to configure a homogeneous coating region on the at least one substrate, wherein a homogeneous coating on the at least one substrate is implemented by a sloping down profile of the gradient mask in the homogeneous coating region and wherein the single gradient mask is shaped to include:
        a region with a lateral film thickness gradient on the at least one substrate, wherein the region with the lateral film thickness gradient has a local elevated portion in a form of a peak, wherein a slope flanking the local elevated portion determines a film thickness gradient on the at least one substrate, or
        a region with a lateral film thickness gradient on the at least one substrate, wherein the region with the lateral film thickness gradient has a local depression in a form of a valley, wherein a slope flanking the local depression determines a film thickness gradient on the at least one substrate, or
        two regions with lateral film thickness gradients on the at least one substrate, wherein the two regions having lateral film thickness gradients each having a local elevated portion in a form of a peak, wherein a pitch flanking each local elevated portion determines a film thickness gradient on the at least one substrate.

2. The device in accordance with claim 1, wherein the coating source is a linear, annular, or tubular magnetron source.

3. The device in accordance with claim 1, wherein the at least one substrate consists of a glass or a plastic.

4. The device in accordance with claim 1, wherein the at least one substrate is an optical component.

5. The device in accordance with claim 4, wherein the optical component is selected from the group consisting of lenses, aspheres, and freeform optics.

6. The device in accordance with claim 5, wherein the lenses are planar, convex, or concave.

7. A method of coating substrates by magnetron sputtering, in which
    a) at least one substrate is arranged in an associated at least one substrate holder on a turntable in a vacuum chamber, with the turntable enabling a first rotational movement of the at least one substrate and the at least one substrate holder enabling a second rotational movement, with the second rotational movement taking place via a controllable motor coupled to the at least one substrate holder;
    b) at least one film is deposited on the at least one substrate in a coating cycle by utilizing at least one magnetron source having at least one magnetron electrode, with layers of source material of the at least one magnetron electrode being formed by a sputter gas and optionally a reactive gas, with a gradient mask having a first region that has a geometry for an inhomogeneous coating of the at least one substrate, with the gradient mask having at least one local elevated portion or at least one local depression in profile, with a film layer thickness gradient on the at least one substrate being settable via a slope at a flank of the at least one local elevated portion or the at least one local depression in profile; and a second region having a geometry that effects a homogeneous coating of the at least one substrate, being utilized; and c) the first rotational movement being coordinated with the second rotational movement by controlling the controllable motor with a controller such that the second rotational movement only takes place in a time period in which the at least one substrate is not below the at least one magnetron source, wherein the at least one controllable motor is controlled by the controller such that the second rotational movement of the at least one substrate is a step-wise rotational movement taking place with n steps and a movement by an angle of 360*/n, wherein n is an integer multiplied with 3, wherein the first rotational movement of the turntable takes place at a speed of 10 to 300 r.p.m.;

the second rotational movement of the at least one substrate takes place in predefined steps and is controlled by software, wherein an increment of the predefined steps is calculated so that a specific film profile is produced at every angular position of the at least one substrate, wherein a number of required predefined steps is calculated in advance by the software;

the at least one controllable motor is fixed to the at least one substrate holder and arranged inside the vacuum chamber;

the gradient mask is a single gradient mask and is shaped to enable a homogeneous coating region on the at least one substrate, wherein a homogeneous coating on the at least one substrate is implemented by a sloping down profile of the gradient mask in the homogeneous coating region and wherein the single gradient mask is shaped to include a region with a lateral film thickness gradient on the at least one substrate, wherein the region with the lateral film thickness gradient has a local elevated portion in the form of a peak, wherein a slope flanking the local elevated portion determines a film thickness gradient on the at least one substrate, or a region with a lateral film thickness gradient on the at least one substrate, wherein the region with the lateral film thickness gradient has a local depression in a form of a valley, wherein a slope flanking the local depression determines a film thickness gradient on the at least one substrate, or two regions with lateral film thickness gradients on the at least one substrate, wherein the two regions having lateral film thickness gradients each have a local elevated portion in a form of a peak, wherein a pitch flanking the local elevated portion determines a film thickness gradient on the at least one substrate.

8. The method in accordance with claim 7, wherein a deposited film thickness per film is in a range from 1 to 1000 nm, and a number of layers is in a range from 1 to 1000.

9. The method in accordance with claim 7, wherein a shape of the gradient mask is detected via a local distribution of a coating rate, with the coating rate being determined via a shape of a lens in dependence on the shape of the gradient mask.

* * * * *